(12) United States Patent
Maeda

(10) Patent No.: US 6,423,578 B2
(45) Date of Patent: Jul. 23, 2002

(54) FIELD-EFFECT TRANSISTOR AND MANUFACTURE THEREOF

(75) Inventor: Tatsuro Maeda, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 09/750,441

(22) Filed: Dec. 28, 2000

(30) Foreign Application Priority Data

Jan. 28, 2000 (JP) ........................................ 2000-020045

(51) Int. Cl.[7] .................. H01L 21/44; H01L 21/00; H01L 21/30; H01L 21/48
(52) U.S. Cl. .................. 438/118; 438/149; 438/151; 438/458
(58) Field of Search ................ 438/281, 24, 118, 438/28, 149, 151, 458, 404, 537

(56) References Cited

U.S. PATENT DOCUMENTS

| | | | | |
|---|---|---|---|---|
| 2,986,481 A | * | 5/1961 | Gudmundsen ............... 117/53 |
| 3,510,733 A | * | 5/1970 | Addamiano ................. 257/744 |
| 3,623,219 A | * | 11/1971 | Stoller et al. ............... 257/506 |
| 6,096,582 A | * | 8/2000 | Inoue et al. ................ 438/118 |
| 6,194,239 B1 | * | 2/2001 | Tayanaka .................... 438/24 |

FOREIGN PATENT DOCUMENTS

JP  62-1270  1/1987  ........... H01L/29/78

* cited by examiner

*Primary Examiner*—John F. Niebling
*Assistant Examiner*—Walter L. Lindsay, Jr.
(74) *Attorney, Agent, or Firm*—Workman, Nydegger & Seeley

(57) ABSTRACT

A source and a drain of a field-effect transistor are formed so as to fulfill a specified physical relationship to upper and lower gates thereof and thereby parasitic capacitance that hampers its high-speed operation is minimized. The filed-effect transistor includes a second support substrate, a lower gate that is embedded in an insulator formed on the second support substrate, an insulating layer formed on the lower gate, a semiconductor layer formed on the insulating layer, an insulating layer formed on the semiconductor layer, an upper gate formed on the insulating layer, as well as a source electrode, a drain electrode, an upper gate electrode, and a lower gate electrode all of which are isolated from one another by the insulating layer.

1 Claim, 9 Drawing Sheets

FIELD-EFFECT TRANSISTOR AND MANUFACTURE THEREOF

This application is based on Patent Application No. 2000-020045 filed Jan. 28, 2000 in Japan, the content of which is incorporated hereinto by reference.

BACKGROUND OF THE INVENTION

1. Field of the Invention

The present invention relates to a method for forming an embedded gate to realize a high-performance transistor, and particularly to a double-gate field-effect transistor that is obtained by forming fine gates, and a method for manufacturing the same.

2. Description of the Related Art

In connection with a progress of transistors toward miniaturization, a short channel effect that the threshold voltage of the transistor varies due to variation in the gate length of the transistor becomes significant. To prevent the short channel effect and increase driving capability of the transistor, it is known that the use of the double gate structure in the transistor (refer to Japanese Patent Application Laid-open No. 62-1270 (1987)) is the most suitable method.

However, up to the present, there has not been known an industrial method for manufacturing the double gate structure practically. Especially, a method for manufacturing the double gate in such a way that a source and a drain are formed so as to fulfill a specified physical relationship to the upper and lower gates for minimizing parasitic capacitance that hampers a high-speed operation thereof is not yet in sight in every way.

SUMMARY OF THE INVENTION

The present invention was devised with intent to solve the above-mentioned problem, and the object of the present invention is to provide a double-gate field-effect transistor with aligned upper and lower gates, and an industrial method for manufacturing the same.

The present invention is devised to achieve such objects as mentioned above, and a first invention as included by the present invention has a transistor structure comprising: a first gate embedded in an insulator on a support substrate and being in contact with an insulating layer on the insulator; a source and a drain formed in a semiconductor layer on the insulating layer; and a second gate formed in an embedded insulating layer that is formed on the semiconductor layer, and is characterized in that the first gate and the second gate are opposite to each other through the intermediaries therebetween consisting of the insulating layer, the semiconductor layer, and the embedded insulating layer.

Furthermore, a second invention as included by the present invention is characterized in that wiring of four electrodes that are to be connected to the source, the drain, the first gate, and the second gate, respectively, is formed in the first invention.

Moreover, a third invention as included by the present invention is characterized in that an adjustment hole that reaches as deep as the support substrate is provided in a depressed manner to position the first gate and the second gate to each other in the first invention.

Furthermore, a fourth invention as included by the present invention is characterized by comprising the steps of: forming a semiconductor layer on a first support substrate through the intermediary of an embedded insulating layer; forming an adjustment hole that penetrates the embedded insulating layer and the semiconductor layer in a depressed manner on the first support substrate; providing further an insulating layer on the semiconductor layer and forming a first gate at a predetermined position set apart from the adjustment hole on the insulating layer; forming the insulator on the insulating layer and further gluing a second support substrate onto the insulator; removing the first support substrate and forming a second gate at a predetermined position set apart from the adjustment hole on the embedded insulating layer; and providing a source and a drain on the embedded insulating layer side and forming wiring of electrodes that connects to the source, the drain, the first gate, and the second gate, respectively.

According to the present invention that specifies such configuration as this, a method for manufacturing easily a double-gate filed-effect transistor with aligned upper and lower gates of a fine structure capable of high-speed operation can be provided.

The above and other objects, features and advantages of the present invention will become more apparent from the following description of embodiments thereof taken in conjunction with the accompanying drawings.

DESCRIPTION OF THE PREFERRED EMBODIMENTS

Figure 1:
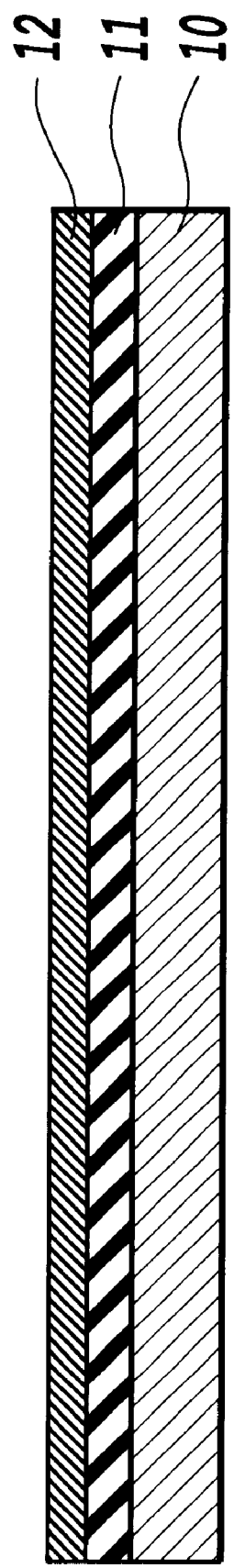
FIG. 1 is a structural drawing showing an example of an SOI substrate.

A form of implementing a field-effect transistor according to the present invention is described referring to the drawings based on one embodiment. The method for manufacturing a double-gate field-effect transistor with aligned upper and lower gates according to the present invention will be explained step by step in FIGS. 1 to 9.

First, explained is one example of a manufacturing process of a first support substrate in the method for manufacturing a field-effect transistor according to the present invention. FIG. 1 shows one example of an SOI (SILICON ON INSULATOR) substrate. The SOI substrate is such that an embedded insulating layer 11 is formed on the first support substrate 10 and further a semiconductor layer 12 (for example, a thin silicon film) is formed thereon.

Figure 2:
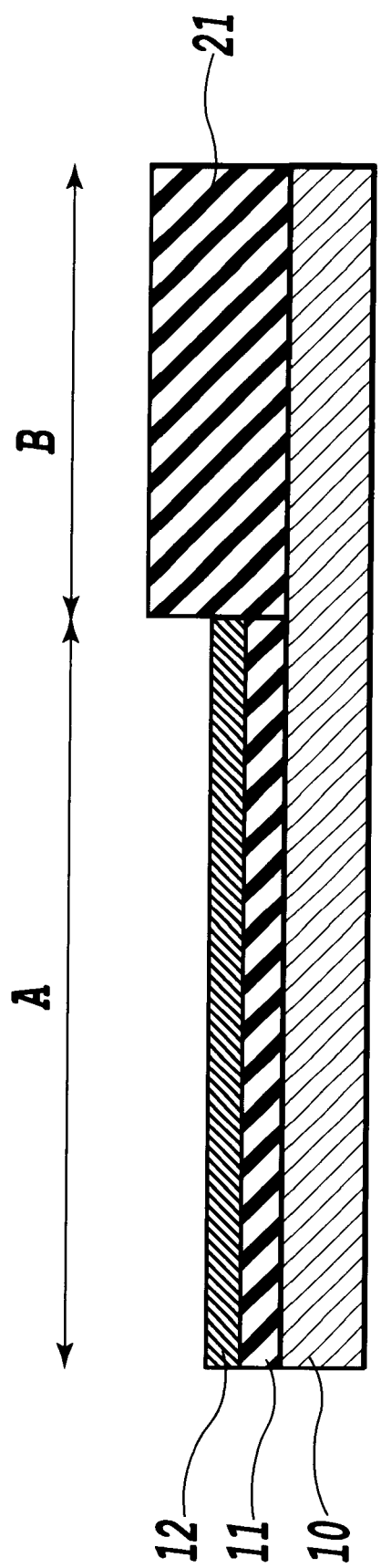
FIG. 2 is a structural drawing showing an example of a procedure for isolating regions in the method for manufacturing a field-effect transistor according to the present invention.

FIG. 2 shows one example of a procedure of region isolation. A part of both of the embedded insulating layer 11 and the semiconductor layer 12 on the first support substrate 10 is removed using a lithography technique and an etching technique and an insulating layer 21 is formed on this region. A region of the insulating layer 21 is named as an adjustment mark region B and an adjustment mark is formed in this region. Thus, a device region A and the adjustment mark region B are formed on the support substrate.

Figure 3:
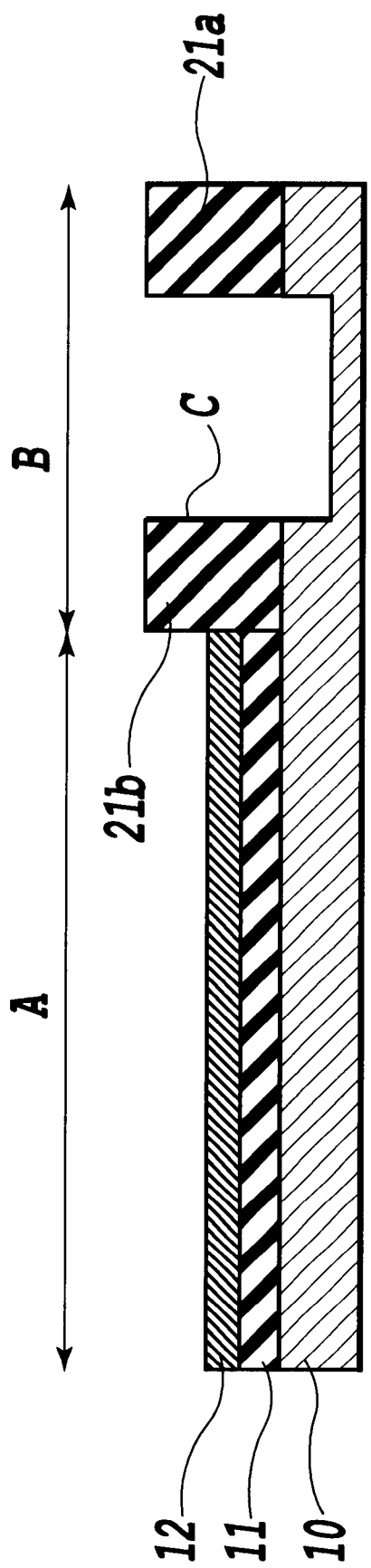
FIG. 3 is a structural drawing showing an example of a first support substrate on which an adjustment mark is formed in the method for manufacturing the field-effect transistor according to the present invention.

FIG. 3 shows one example of the first support substrate on which the adjustment mark was formed. An adjustment mark C is formed by digging a groove in the adjustment mark region B by etching. The depth of the groove goes down to reach the first support substrate 10 and this depth is such a depth that enables to recognize the adjustment mark C from the back side when the first support substrate 10 is removed in a subsequent process.

Figure 4:
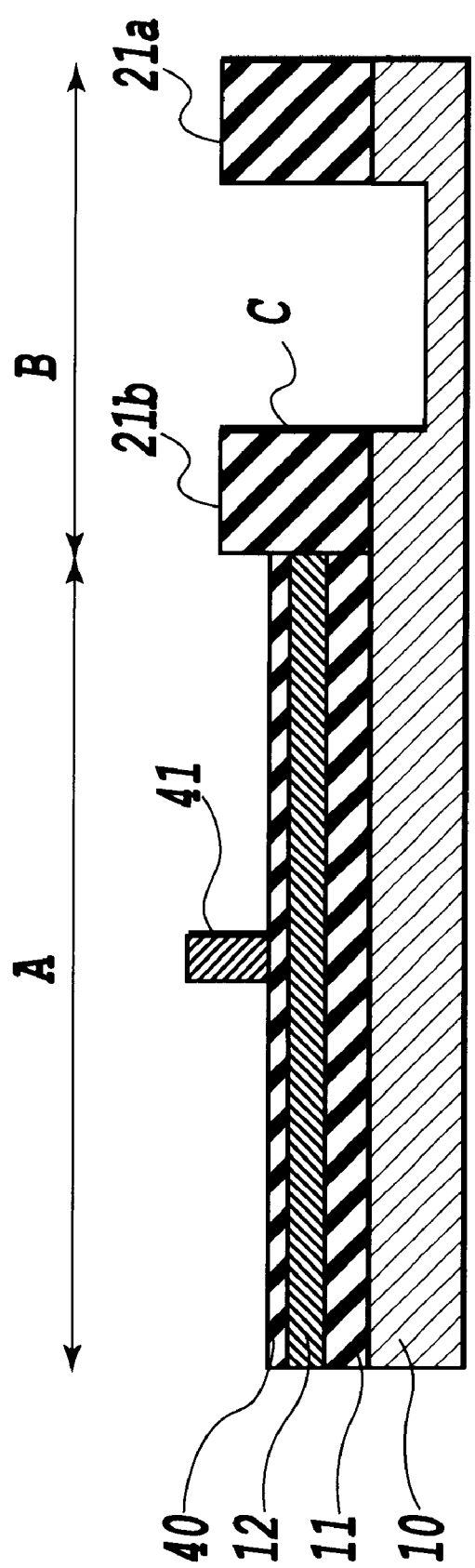
FIG. 4 is a structural drawing showing one example of a procedure for making a lower gate in the method for manufacturing the field-effect transistor according to the present invention.

Next, explained is one example of a process of gluing the first support substrate and the second support substrate together in the method for manufacturing the field-effect transistor according to the present invention. FIG. 4 shows one example of a procedure for making a lower gate. A gate layer is formed on an insulating film 40 on the semiconductor layer 12 in the device region A. Next, the gate layer is processed by etching to form a lower gate 41 which is a first gate so as to fulfill a specified physical relationship to the adjustment mark C.

Figure 5:
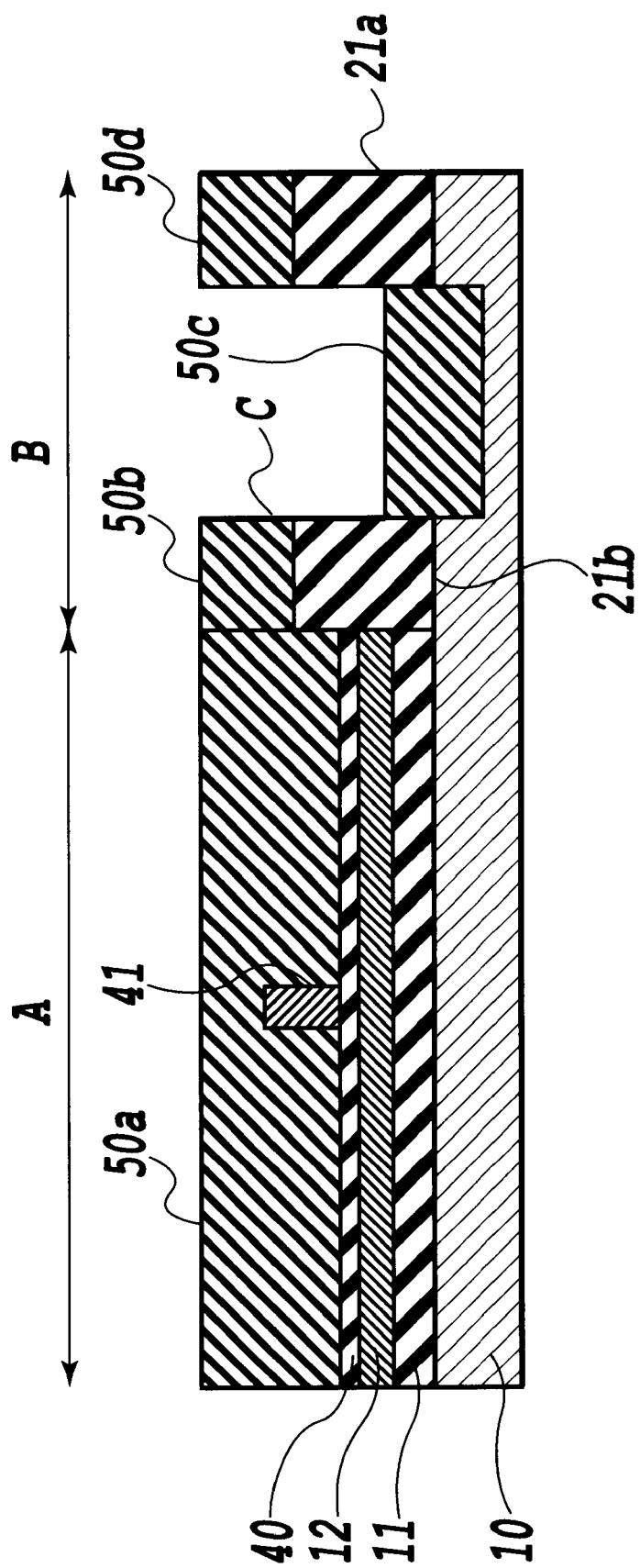
FIG. 5 is a structural drawing showing how a lamination agent is formed in the method for manufacturing the field-effect transistor according to the present invention.

FIG. 5 shows a situation where a lamination agent is formed. After the formation of the lower gate 41, lamination agents (insulators) 50a to 50d for gluing the second support substrate to this structure on the first support substrate are formed. Therefore, the lower gate 41 is embedded in the lamination agent (insulator) 50a.

Figure 6:
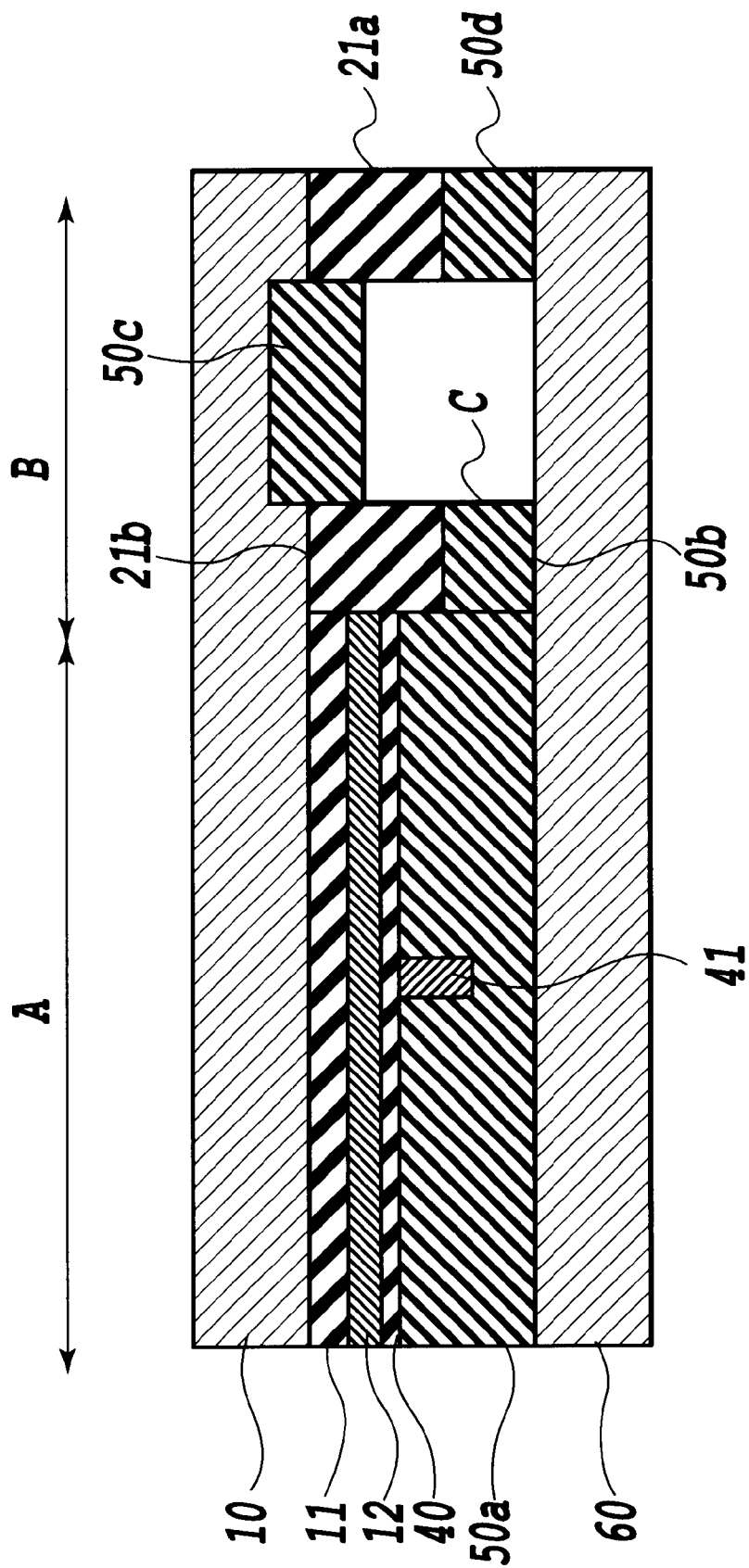
FIG. 6 is a structural drawing showing a situation where a second support substrate is glued to the first support substrate in the method for manufacturing the field-effect transistor according to the present invention.

FIG. 6 shows a situation where the second support substrate is glued to the first support substrate. The first support substrate 10 and the structure constructed thereon in which the lower gate 41 was formed are reversed upside down and glued to a second support substrate that was prepared separately.

Figure 7:
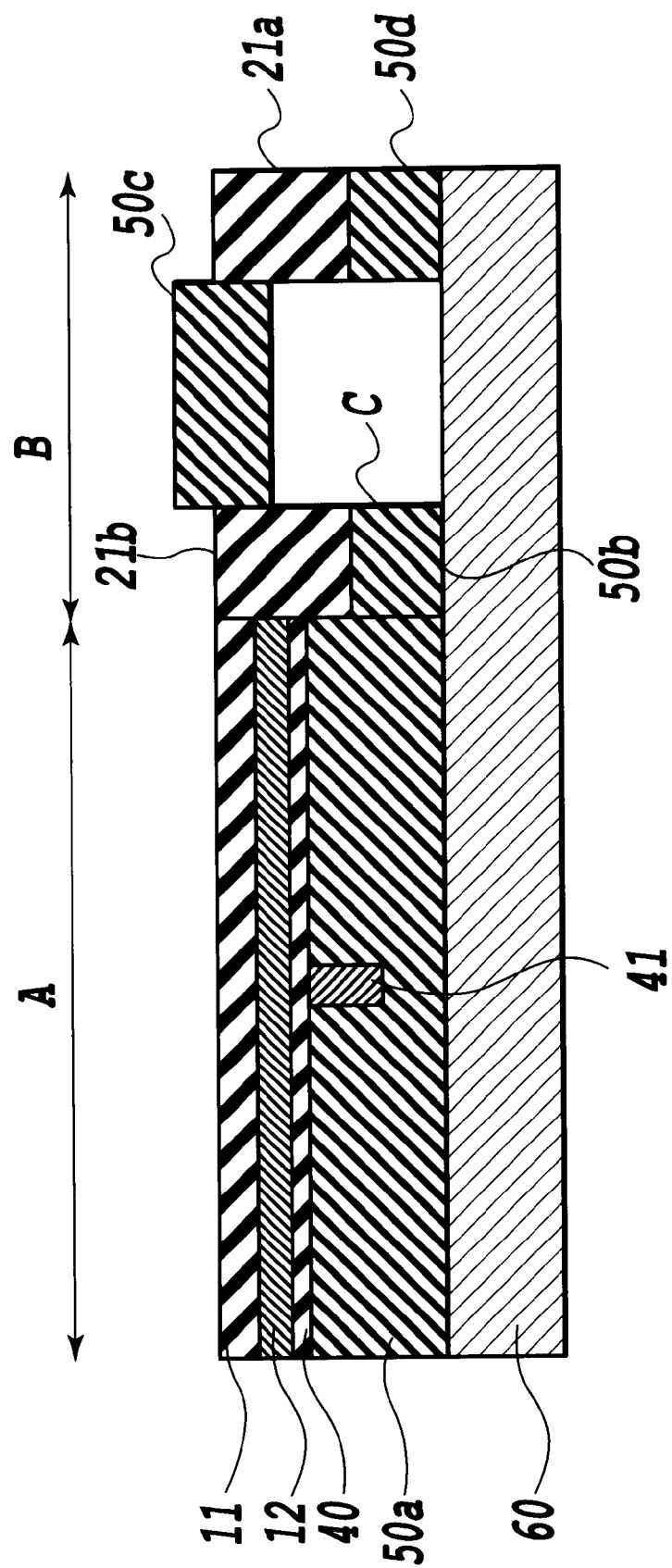
FIG. 7 is a structural drawing showing a situation where the first support substrate is removed in the method for manufacturing the field-effect transistor according to the present invention.

Next, explained is one example of the manufacturing process of the second support substrate in the method for manufacturing the field-effect transistor according to the present invention. FIG. 7 shows a situation where the first support substrate is removed. The first support substrate 10 is removed by etching, using the embedded insulating layer 11 as a removal stop layer. On this occasion, the lamination agent (insulator) 50c that was formed inside the adjustment mark C is exposed.

Figure 8:
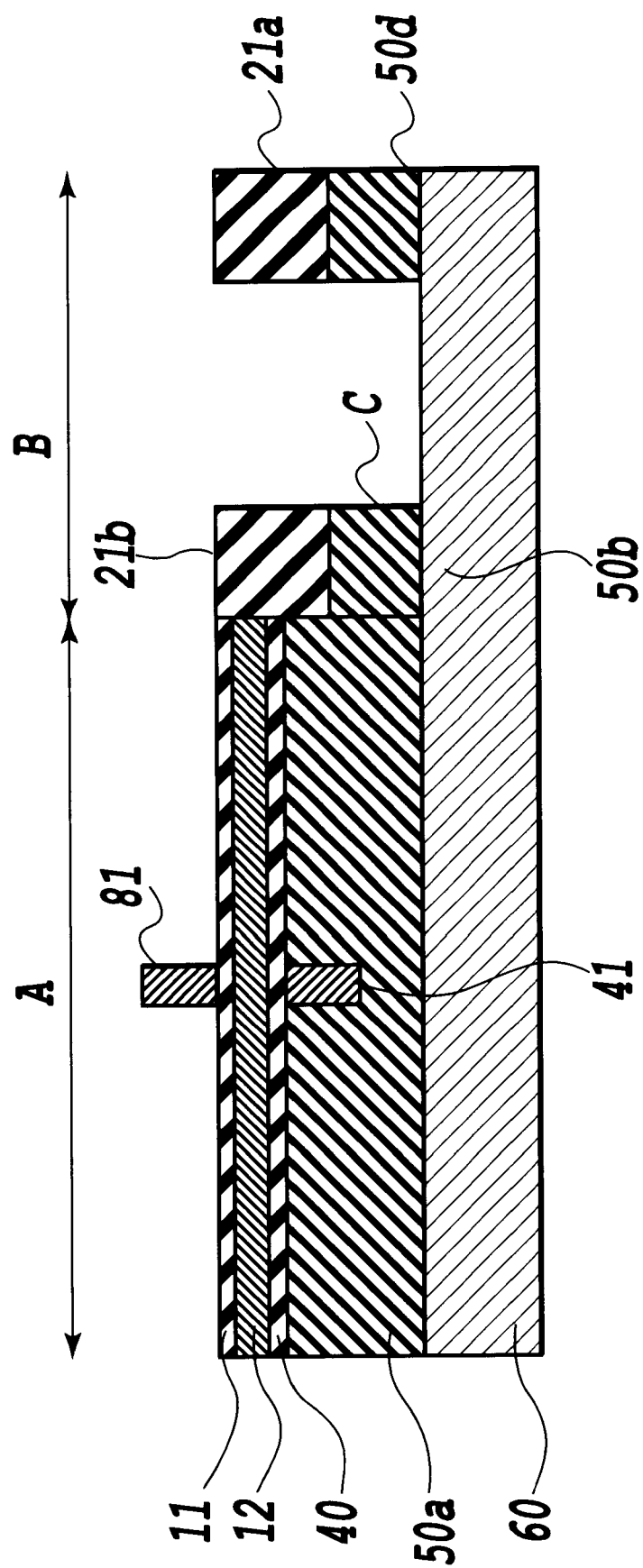
FIG. 8 is a structural drawing showing one example of a procedure for making an upper gate in the method for manufacturing the field-effect transistor according to the present invention.

FIG. 8 shows one example of a procedure for making an upper gate. The embedded insulating layer 11 is selectively removed by etching, and subsequently a gate layer is formed. The gate layer is processed by etching and an upper gate 81 which is the second gate is formed. The formation of the upper gate 81 is fabricated by etching the gate layer while a position of the upper gate 81 is aligned to the lower gate 41 through the use of the adjustment mark C that was exposed. Through these steps, the upper gate 81 (the second gate) and the lower gate 41 (the first gate) can be aligned to each other.

Figure 9:
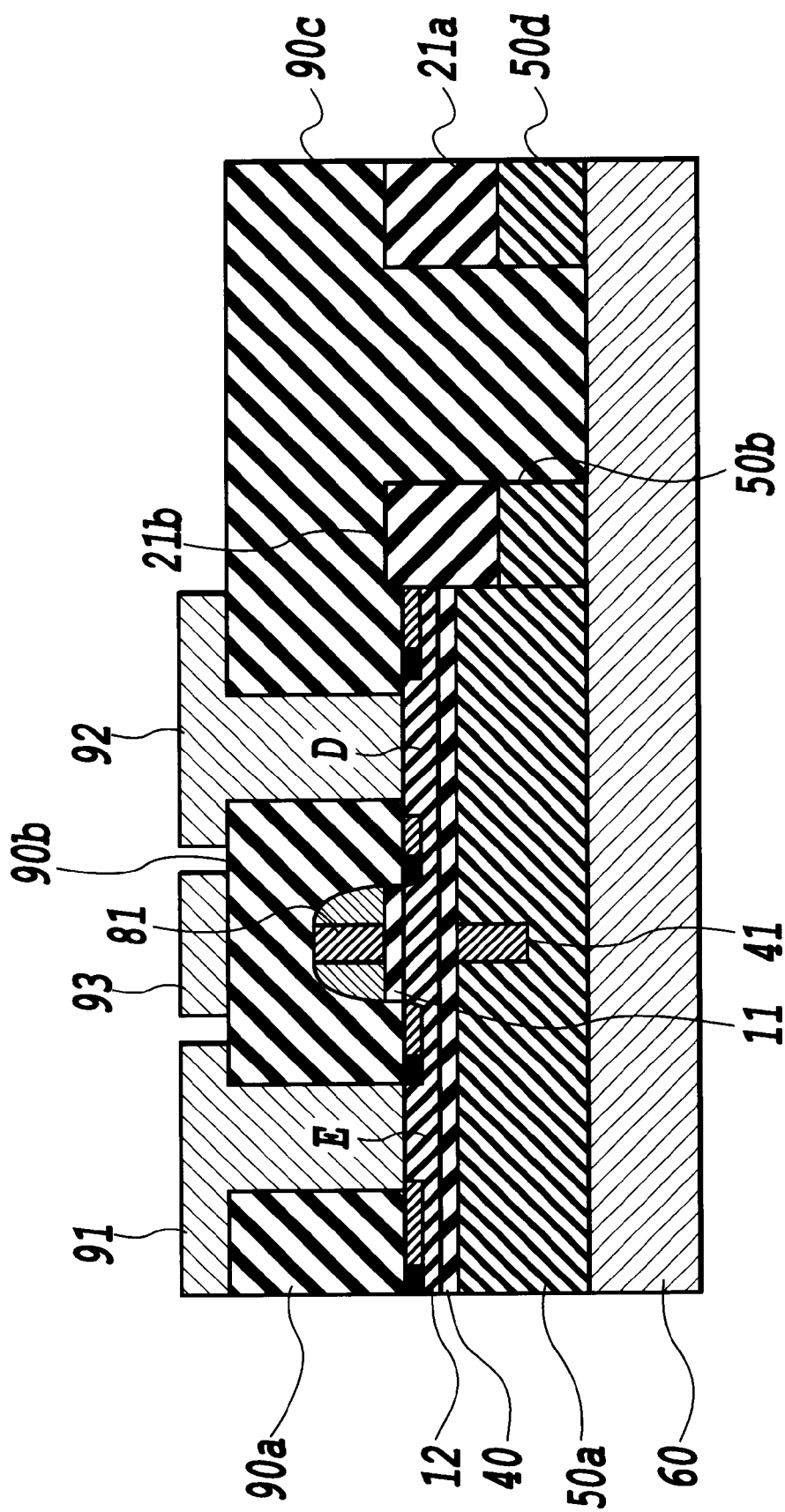
FIG. 9 is a structural drawing showing one example of a procedure for making electrodes in the method for manufacturing the field-effect transistor according to the present invention.

FIG. 9 shows one example of a procedure for making electrodes. Interlayer insulating films 90a to 90c are formed at the side of the removed first support substrate 10 and subsequently a source electrode 91 and a drain electrode 92 are formed. Moreover, an upper gate electrode 93 connecting to the upper gate 81 and a lower gate electrode connecting to the lower gate 41 are formed. Incidentally, the lower gate electrode connecting to the lower gate 41 is not shown in the figure. The lower gate electrode is connected to the lower gate 41 by digging a hole for contact through the interlayer insulating film in a region other than the device region A, either in a region located in the backward region or in a region located in the frontward region. In this way, there can be obtained the double-gate field-effect transistor with aligned upper and lower gates having four electrodes wherein the source electrode 91, the drain electrode 92, the upper gate electrode 93, and the lower gate electrode are positioned on the side of the first support substrate 10 that has been removed.

The double-gate field-effect transistor formed by the above-described manufacturing method includes the second support substrate, the lower gate embedded in the insulator formed on the second support substrate, the insulating layer formed on the lower gate, the semiconductor layer formed on the insulating layer, a source and a drain formed in the semiconductor layer, the insulating layer formed on the semiconductor layer, the upper gate formed on the insulating layer, as well as the source electrode, the drain electrode, the upper gate electrode, and the lower gate electrode.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A method for manufacturing a double-gate field-effect transistor comprising the steps of:

forming a semiconductor layer on a first support substrate through the intermediary of an embedded insulating layer;

forming an adjustment hole that penetrates said embedded insulating layer and said semiconductor layer in a depressed manner on said first support substrate;

providing an insulating layer on said semiconductor layer additionally and forming a first gate at a predetermined position set apart from said adjustment hole on the insulating layer;

forming the insulator on said insulating layer and further gluing a second support substrate on said insulator;

removing said first support substrate and forming a second gate at a predetermined position set apart from said adjustment hole on said embedded insulating layer; and forming a source and a drain on the side of said embedded insulating layer and forming wiring of electrodes that connect to said source, said drain, said first gate, and said second gate, respectively.

* * * * *

UNITED STATES PATENT AND TRADEMARK OFFICE
CERTIFICATE OF CORRECTION

PATENT NO.      : 6,423,578 B2
DATED           : July 23, 2002
INVENTOR(S)     : Tatsuro Maeda It is certified that error appears in the above-identified patent and that said Letters Patent is hereby corrected as shown below:

<u>Title page,</u>
Item [57], ABSTRACT,
Line 4, change "filed" to -- field --

<u>Column 3,</u>
Line 50, before "that" insert -- 60 --

Signed and Sealed this

Twenty-first Day of January, 2003

JAMES E. ROGAN
*Director of the United States Patent and Trademark Office*